(12) United States Patent
Rivers et al.

(10) Patent No.: US 6,682,863 B2
(45) Date of Patent: Jan. 27, 2004

(54) DEPOSITING AN EMISSIVE LAYER FOR USE IN AN ORGANIC LIGHT-EMITTING DISPLAY DEVICE (OLED)

(75) Inventors: Andrea S. Rivers, Bloomfield, NY (US); Manh Tang, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/184,417

(22) Filed: Jun. 27, 2002

(65) Prior Publication Data

US 2004/0002016 A1 Jan. 1, 2004

(51) Int. Cl.[7] .............................. G03C 5/04; G03F 7/34
(52) U.S. Cl. ............................ 430/22; 430/30; 430/200
(58) Field of Search .............................. 430/22, 30, 200

(56) References Cited

U.S. PATENT DOCUMENTS

| 5,688,551 A | 11/1997 | Littman et al. ............. 430/200 |
| 5,851,709 A | 12/1998 | Grande et al. .............. 430/200 |
| 5,998,085 A | * 12/1999 | Isberg et al. ................ 430/200 |
| 6,114,088 A | 9/2000 | Wolk et al. ................. 430/200 |
| 6,140,009 A | 10/2000 | Wolk et al. ................. 430/200 |
| 6,214,520 B1 | 4/2001 | Wolk et al. ................. 430/200 |
| 6,221,553 B1 | 4/2001 | Wolk et al. ................. 430/200 |
| 6,555,284 B1 | * 4/2003 | Boroson et al. ............. 430/200 |
| 6,582,875 B1 | * 6/2003 | Kay et al. ................... 430/200 |

* cited by examiner

Primary Examiner—Richard L. Schilling
(74) Attorney, Agent, or Firm—Raymond L. Owens

(57) ABSTRACT

A method for depositing an OLED emissive layer, includes: providing an OLED substrate having at least one discernible feature; providing a beam of light which is transversely and angularly movable; providing an unpatterned donor element including emissive material and having an energy absorbing layer, arranged so that when the donor element is properly positioned relative to the OLED substrate, the beam of light can be absorbed by the energy-absorbing layer to heat the emissive material and cause its transfer; detecting the location of the discernible feature on the OLED substrate relative to the position of the beam to determine the position and orientation of the OLED substrate relative to the beam; angularly moving the beam and then moving the beam in a raster fashion, in accordance with the detected position and orientation of the OLED substrate, and changing the timing of actuation of the light beam as it is moved to different transverse positions.

22 Claims, 10 Drawing Sheets

DEPOSITING AN EMISSIVE LAYER FOR USE IN AN ORGANIC LIGHT-EMITTING DISPLAY DEVICE (OLED)

CROSS REFERENCE TO RELATED APPLICATIONS

Reference is made to commonly assigned U.S. patent application Ser. No. 10/055,579, filed Jan. 23, 2002, now U.S. Pat. No. 6,582,875, entitled "Using a Multichannel Linear Laser Light Beam in Making OLED Devices by Thermal Transfer" by Kay et al, and commonly assigned U.S. patent application Ser. No. 10/021,410 filed Dec. 21, 2001, entitled "Apparatus for Permitting Transfer of Organic Material From a Donor to Form a Layer in an OLED Device" by Phillips et al; the disclosures of which are incorporated herein by reference.

FIELD OF THE INVENTION

The present invention relates to depositing emissive layers on an OLED substrate.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electron transport layer (for electron transport). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, it is challenging to align the substrate and the shadow mask, such that pixels are formed in the appropriate locations. When it is desirable to increase the substrate size, it is increasingly difficult to manipulate the shadow mask as part of the alignment process to form appropriately positioned pixels. A further disadvantage of the shadow-mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision for accurately forming EL devices.

A method for patterning high-resolution organic EL displays has been disclosed in commonly-assigned U.S. Pat. No. 5,851,709 by Grande et al. This method is comprised of the following sequences of steps: 1) providing a substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow-mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. A series of patents by Wolk et al. (U.S. Pat. Nos. 6,114,088; 6,140,009; 6,214,520; and 6,221,553) teaches a method that can transfer the luminescent layer of an EL device from a donor sheet to a substrate by heating selected portions of the donor with laser light. Wolk et al. comments that the use of light can be the preferred thermal transfer modality, in that it enables the precision registration needed in the manufacture of large scale devices. While laser thermal transfer does enable precision registration, it is essential that the beam of light be aligned and directed such that the correct regions of the substrate receive transferred donor material.

SUMMARY OF THE INVENTION

It is therefore an object of the present invention to provide a method for aligning a laser beam pattern with pixel portions of an OLED substrate, and correcting for lateral and angular displacement, and for the effects of thermal expansion without the limitations imposed by conventional photolithography or the shadow mask methods or the use of patterned donor materials.

This object is achieved by a method for depositing an emissive layer for use in an organic light-emitting display device (OLED), comprising the steps of:

(a) providing an OLED substrate having at least one discernible feature which is usable for locating the position and orientation of the OLED substrate for properly depositing the emissive layer relative to pixel portions of the OLED substrate;

(b) providing a light source that provides a beam of light which is transversely and angularly movable to selected positions to change the relative location of a beam of light produced by such source;

(c) providing an unpatterned donor element including emissive material and having an energy-absorbing layer, arranged so that when the donor element is properly positioned relative to the OLED substrate, the beam of light can be absorbed by the energy-absorbing layer to heat the emissive material and cause the transfer of such emissive material to the OLED substrate;

(d) positioning the donor element in a transfer relationship to the OLED substrate;

(e) detecting the location of the discernible feature on the OLED substrate to determine the position and orientation of the OLED substrate relative to the light source; and (f) angularly moving the beam of light and then moving the beam of light in a first transverse direction until a first end point is reached and then moving the beam of light in a perpendicular direction and again transversely moving the beam of light in a second direction parallel to but opposite to the first direction to a second end point and actuating the transversely moving beam of light in the first or second directions or both directions in accordance with the detected position and orientation of the OLED substrate by changing the timing of such actuation as the beam of light is moved to different transverse positions.

An advantage of this method is that it provides for an effective method of forming emissive layers with fewer defects. A further advantage is that the present invention allows for adjustments due to changes in the dimensions of substrates due to ambient temperature changes. A further advantage of this method is that it can maintain EL spot precision on large EL panels, which is difficult or impossible to do with existing methods. A further advantage is that the method is quickly and easily scalable to any size EL panels and/or different pixel sizes without the need to wait for a different-size shadow mask to be fabricated, and can be more easily scaled up to produce larger display units than other methods. A further advantage is that this method can be fully automated including donor and substrate media handling. The present invention is particularly suitable for forming organic layers over a large area having a number of OLED display devices, thereby increasing throughput.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least two colors. The term "multicolor" is employed to describe a display panel that is capable of emitting light of a different hue in different areas. In particular, it is employed to describe a display panel that is capable of displaying color images. These areas are not necessarily contiguous. The term "full color" is employed to describe multicolor display panels that are capable of emitting in the red, green, and blue regions of the visible spectrum and displaying images in a wide range of hues or combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel that can be independently addressable to emit a specific color. For example, a blue subpixel is that portion of a pixel that can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1A:
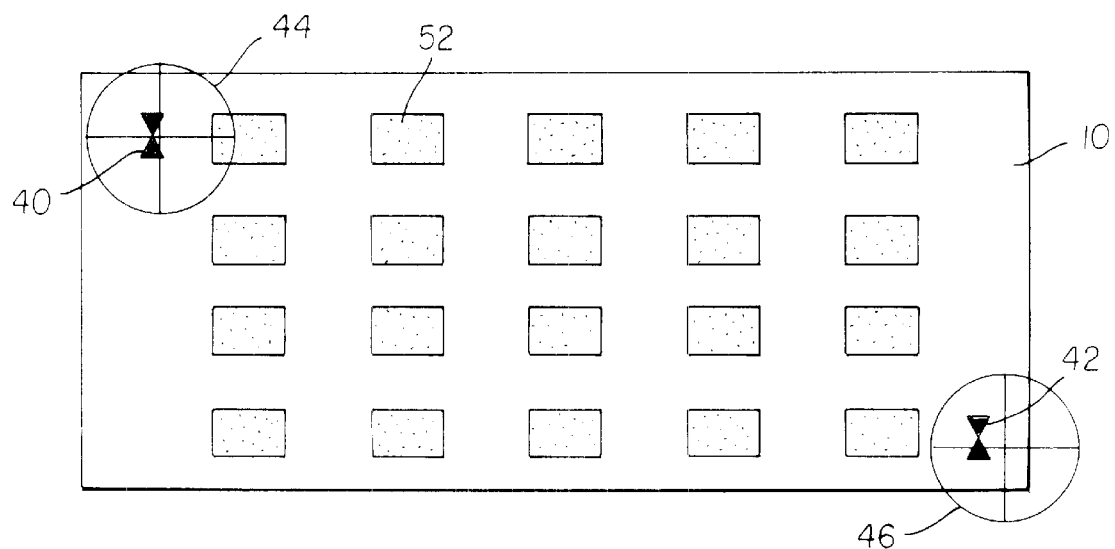
FIG. 1a is a top view of an OLED substrate including an array of pixel portions, discernible features, and one embodiment of the substrate and camera features that can be used to effect this invention.

The tight registration tolerances necessary for small-pixel devices suggest that patterned donor materials can be inappropriate and that a correction for thermal expansion from ambient or other temperature changes of the substrate can be needed. Turning now to FIG. 1a, there is shown a top view of an OLED substrate 10, which includes an array of pixel portions 12. Such pixel portions 12 are each associated with electrodes and can be part of a so-called passive display which has overlapping rows and columns of electrodes, or part of an active display which has a common anode and individual thin-film transistors (TFTs). Each pixel portion 12 can be a pixel (for monochrome displays) or sub-pixel (for full-color displays). The distance between individual pixels or sub-pixels can be desired to be less than 100 micrometers in such devices.

Substrate 10 can be an organic solid, an inorganic solid, or a combination of organic and inorganic solids that provides a surface for receiving the emissive material from a donor. Substrate 10 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 10 can be a homogeneous mixture of materials, a composite of materials, or multiple layers of materials. Substrate 10 can be an OLED substrate, that is a substrate commonly used for preparing OLED devices, e.g. active-matrix low-temperature polysilicon TFT substrate. The substrate 10 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. For the purpose of this invention, substrate 10 is preferably an OLED substrate and the terms "substrate" and "OLED substrate" will be used interchangeably.

FIG. 1*a* additionally shows discernible features on substrate 10. Discernible features are features on substrate 10 which are detectable by a means, e.g. optically, capacitively, or by other means, and are usable for locating the position and orientation of substrate 10 for properly depositing the emissive layer relative to pixel portions 12 in a manner which will be evident. Such discernible features are shown in this example as two spaced-apart fiducial marks 40 and 42, one or more of which have been formed in known positions upon manufacture of substrate 10. Fiducial marks 40 and 42 are designed to enable the identification of a specific point on substrate 10 and can be a number of shapes, including intersecting crosshairs, a triangle, a circle, a square, intersecting triangles, an "X", or any other shape that can be utilized to define a point. For the purposes of this invention, the terms "discernible feature" and "fiducial mark" will be used interchangeably.

FIG. 1*a* additionally shows one embodiment of the substrate 10 and camera features that can be used to effect this invention. Crosshairs of a camera system can be used to define the location of fiducial marks 40 and 42. A first camera includes a crosshairs 44, which is meant to locate fiducial mark 40 in the process of correcting for misalignment. A second camera includes a means of defining a fixed reference in the camera's field of view, such as crosshairs 46, which is meant to locate fiducial mark 42 in the process of correcting for misalignment. The cameras can be video cameras fitted with a lens system to capture the image of the substrate fiducials, and with an internal marker or fixed reference such as an integral crosshairs and/or reticle. The camera and lens system resolution are preferably selected such that the resulting resolution is on the order of 1 micron or less at the image plane or substrate surface. Such camera systems are commercially available from, e.g. Sony, Princeton Instruments, Micro-Lumetics, and Aegis Electronics Group.

Figure 1B:
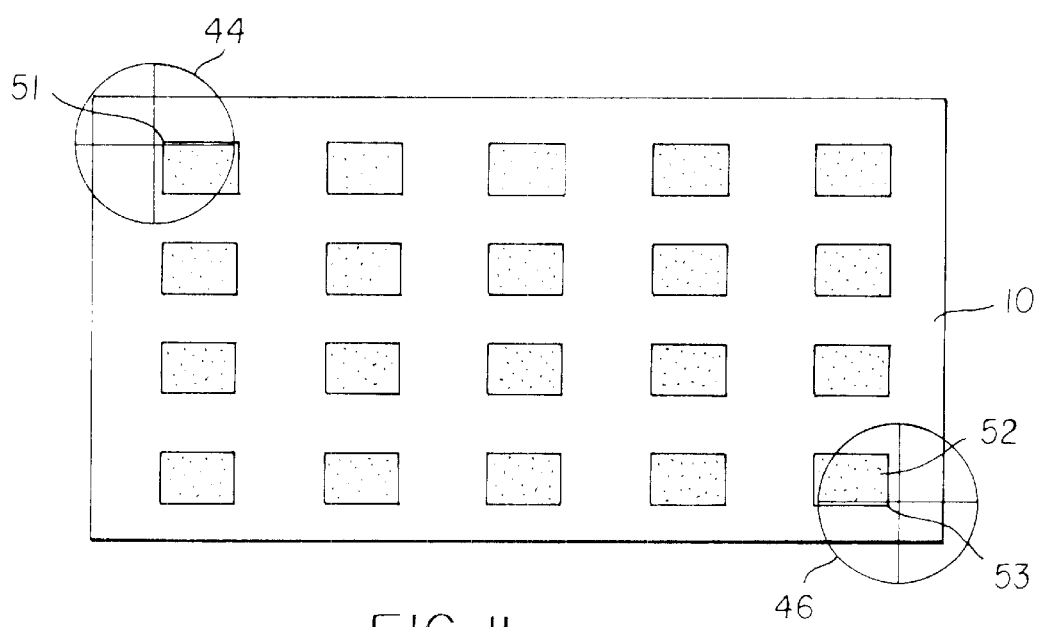
FIG. 1b is an alternate embodiment of the substrate and camera that can be used to effect this invention.

Turning now to FIG. 1*b*, there is shown an alternate embodiment of the substrate 10 and camera features that can be used to effect this invention. In this embodiment, the pixel portions are the discernible feature. Crosshairs of a camera system can be used to define the location of other features on the substrate. In this alternate embodiment, crosshairs 44 is meant to locate corner 51 of pixel portion 50 to define the misalignment. Crosshairs 46 is meant to locate corner 53 of pixel portion 52 to define the misalignment.

Figure 2:
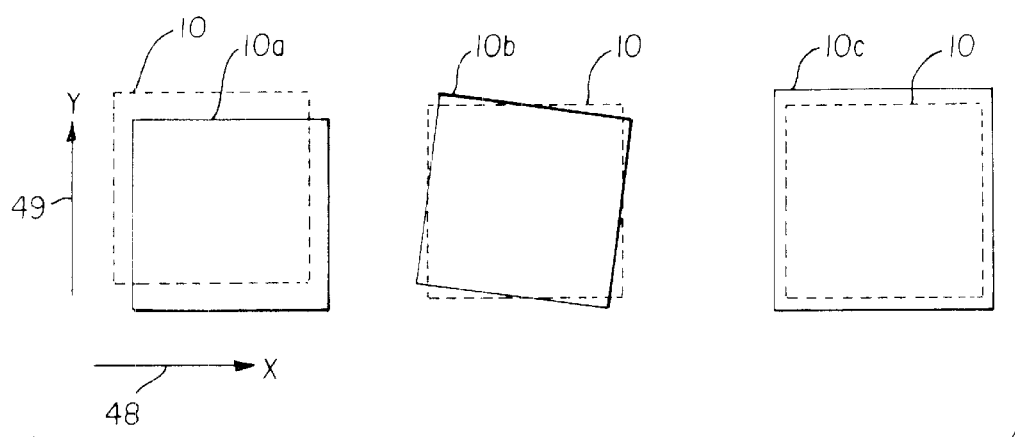
FIG. 2 is a schematic view of several factors that contribute to substrate misalignment.

FIG. 2 is a schematic view of several factors that can contribute to misalignment between the crosshairs 44 and 46 and the corresponding discernible features on the substrate (fiducial marks 40 and 42 or corners 51 and 53). First, substrate 10 can be misaligned laterally, that is in what are commonly called the x and y directions, as shown by misaligned substrate 10*a*. Second, substrate 10 can be misaligned angularly, as shown by misaligned substrate 10*b*. Third, substrate 10 can expand or contract with temperature changes caused by ambient or other temperature changes and variations, as shown by misaligned substrate 10*c*. Misalignment of substrate 10 can be due to any one or any combination of these factors. The method described here can quantify and correct for all these varieties of misalignment. (Other causes of misalignment, such as improperly-placed fiducial marks 40 and 42, are defects which will cause the rejection of substrate 10, and do not need to be corrected for.)

Figure 3A:
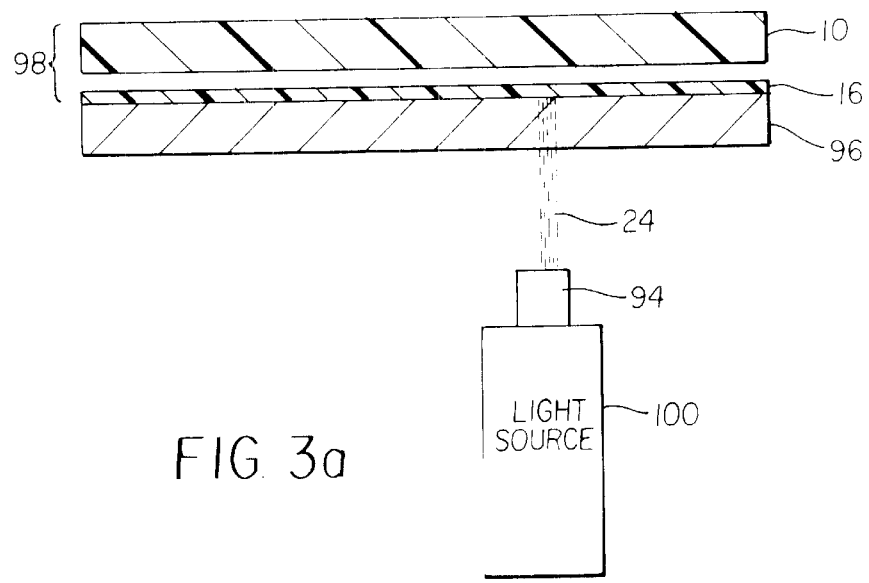
FIG. 3a shows a cross-sectional view of a light source irradiating a secured substrate/donor element combination with a beam of light in accordance with this invention.

FIG. 3*a* shows a cross-sectional view of beam of light 24 from light source 100 irradiating a secured substrate/donor element combination with a beam of light in accordance with this invention. Light source 100 can be any source of light usable in this method, e.g. a laser, a flash lamp, etc. Light source 100 is preferably a laser and most preferably a multichannel laser which emits a modulated multichannel linear laser light beam, the use of which has been described by Kay, et al in above-cited commonly assigned U.S. patent application Ser. No. 10/055,579, now U.S. Pat. No. 6,582,875. Micropositioning devices are not shown for clarity. Donor element 16 is placed in a transfer relationship with substrate 10, that is, donor element 16 is placed in contact with substrate 10 (not shown), or is held with a controlled separation from substrate 10. Donor element 16 is held in position by pressurizing means 96. Pressurizing means 96 can be a transparent support or can be a chamber that is pressurized with gas to secure donor element 16 in a close relationship with substrate 10, as taught by Phillips, et al in above-cited commonly assigned U.S. patent application Ser. No. 10/021,410.

Light source 100 emits beam of light 24 which can be multichannel, that is to say multiple modulated channels of a linear laser light beam, through lens 94. Beam of light 24 is drawn for clarity of illustration as a series of lines to emphasize that it can be multichannel in nature as a plurality of individually addressable channels of laser light. It will be understood that these channels can be contiguous and behave on irradiation as a continuous band of laser light. Beam of light 24 is directed onto donor element 16 through pressurizing means 96, which is transparent, and strikes the non-transfer surface of donor element 16. A desired pattern can be obtained by modulating the channels of beam of light 24 while providing relative motion between beam of light 24 and secured substrate/donor element 98.

Figure 3B:
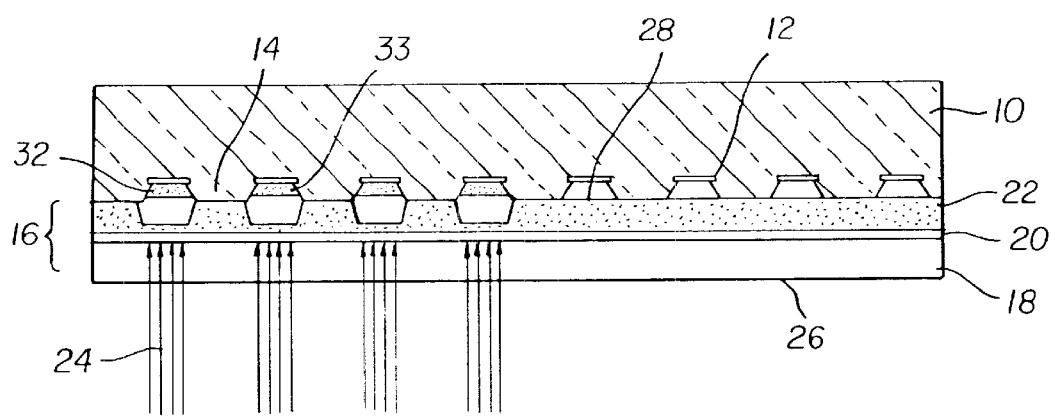
FIG. 3b is a cross-sectional view showing an OLED substrate and a donor element properly positioned relative to the substrate in the practice of this invention.

Turning now to FIG. 3*b*, there is shown a cross-sectional view showing an OLED substrate and a donor element properly positioned relative to the substrate in the practice of this invention. Donor element 16 and substrate 10 are in a transfer relationship, that is, donor element 16 is placed on or close to substrate 10. Donor element 16 includes support 18, energy-absorbing layer 20, and a layer of emissive material 22. Donor element 16 is unpatterned, that is, energy-absorbing layer 20 and emissive material 22 are coated evenly on the surface of support 18. Emissive material 22 is transferred from transfer surface 28 of donor element 16 to substrate 10 by selective irradiation of non-transfer surface 26 of donor element 16 by beam of light 24, which is absorbed by and heats selected portions of energy-absorbing material 20 and thereby heats selected portions of emissive material 22. The selected portions of emissive material 22 are vaporized or sublimed to become emissive layer 32 upon transfer to substrate 10.

Figure 3C:
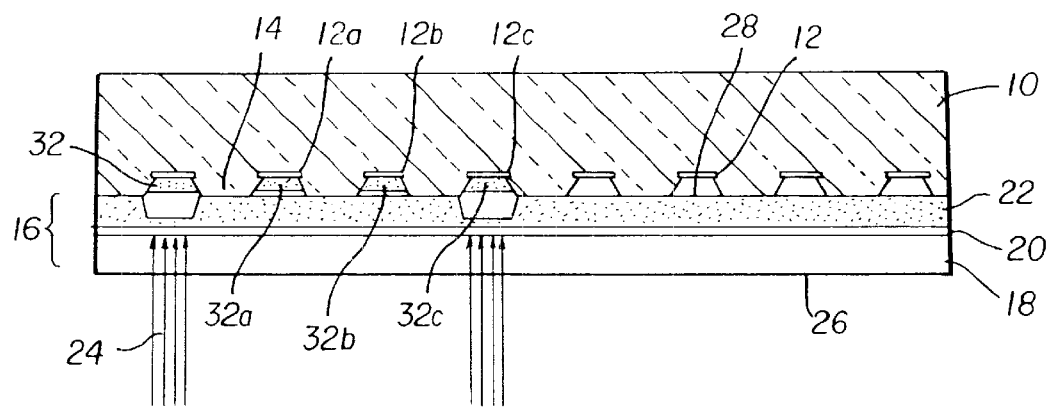
FIG. 3c shows a cross-sectional view of a color OLED substrate and a donor element.

Turning now to FIG. 3c, there is shown a cross-sectional view of a color OLED substrate and a donor element. In the case of forming a color OLED display, multiple emissive layers, each of which can produce a different-colored light, can be formed. Each different-colored emissive layer requires an unpatterned donor element which has an energy-absorbing layer and an emissive material which can emit light of the respective color. For example, three different colored emissive layers can be sequentially deposited as follows: a blue-emitting emissive layer 32a can be formed at a first pixel portion 12a with a first donor element 16 including a blue-emitting emissive material 22, a green-emitting emissive layer 32b can be formed at a second pixel portion 12b with a second donor element 16 including a green-emitting emissive material 22, and a red-emitting emissive layer 32c can be formed at a third pixel portion 12c with a third donor element 16 including a red-emitting emissive material 22. The blue-emitting and green-emitting layers were formed in earlier steps, and this drawing illustrates the formation of red-emitting emissive layer 32c.

Support 18 can be made of any of several materials which meet at least the following requirements: The support must be sufficiently flexible and possess adequate tensile strength to tolerate precoating steps and roll-to-roll or stacked-sheet transport of the support in the practice of the invention. The support must be capable of maintaining the structural integrity during the light-to-heat-induced transfer step while pressurized on one side, and during any preheating steps contemplated to remove volatile constituents such as water vapor. Additionally, the support must be capable of receiving on one surface a relatively thin coating of organic donor material, and of retaining this coating without degradation during anticipated storage periods of the coated support. Support materials meeting these requirements include, for example, metal foils, certain plastic foils, and fiber-reinforced plastic foils. While selection of suitable support materials can rely on known engineering approaches, it will be appreciated that certain aspects of a selected support material merit further consideration when configured as a support useful in the practice of the invention. For example, the support can require a multi-step cleaning and surface preparation process prior to precoating with transferable organic material. If the support material is a radiation-transmissive material, the incorporation into the support or onto a surface thereof, of a radiation-absorptive material can be advantageous to more effectively heat the support and to provide a correspondingly enhanced transfer of transferable organic donor material from the support to the substrate, when using a flash of radiation from a suitable flash lamp or laser light from a suitable laser.

Energy-absorbing layer 20 is capable of absorbing radiation in a predetermined portion of the spectrum and producing heat. Energy-absorbing layer 20 can be a dye such as the dyes specified in commonly assigned U.S. Pat. No. 5,578,416, a pigment such as carbon, or a metal such as nickel, titanium, etc.

A typical OLED device can contain the following layers, usually in this sequence: an anode, a hole-injecting layer, a hole-transporting layer, an emissive layer, an electron-transporting layer, a cathode. Any or all of these can comprise an organic material, which can be a hole-injecting material, a hole-transporting material, an electron-transporting material, a light-emitting material, a host material, or a combination of any of these materials. Of these materials, the practice of this invention is primarily concerned with organic materials that comprise emissive material 22 and with the process for accurately transferring such materials to desired locations on a substrate.

Light-Emitting Material

Light-emitting materials useful as emissive material 22 are well known. As more fully described in commonly assigned U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly assigned U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

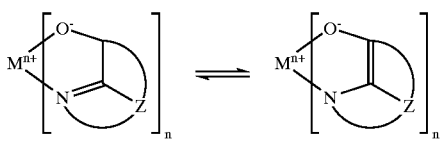

E wherein
M represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzol{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine[alias, tris(8-quinolinolato)indium]
CO-6: Aluminum tris(5-methyloxine)[alias, tris(5-methyl-8-quinolinolato)aluminum(III)]
CO-7: Lithium oxine[alias, (8-quinolinolato)lithium]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

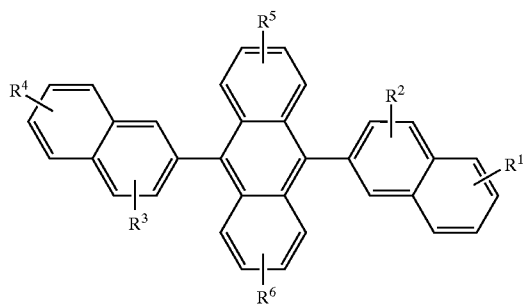

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

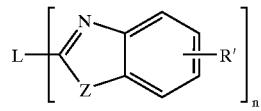

G

Where:

n is an integer of 3 to 8;

Z is O, NR or S; and

R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, ftiryl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

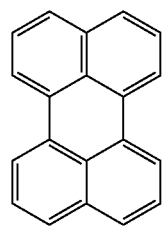
L1
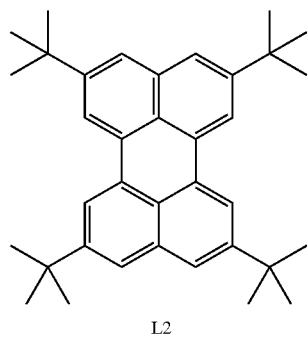
L2
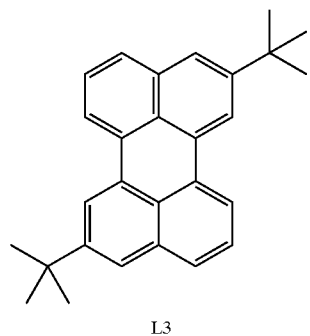
L3
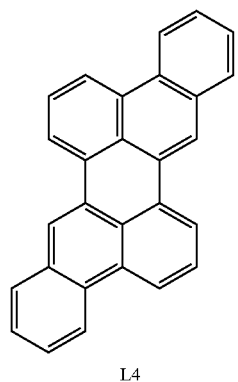
L4
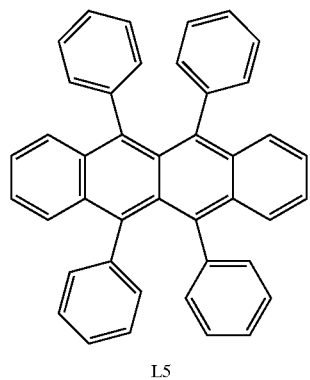
L5
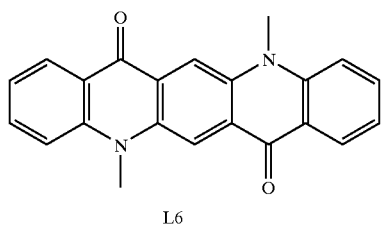
L6
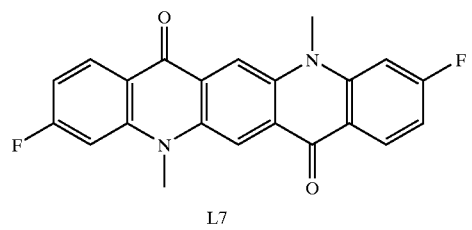
L7
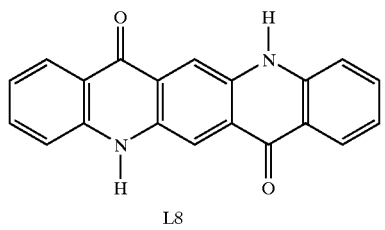
L8

-continued

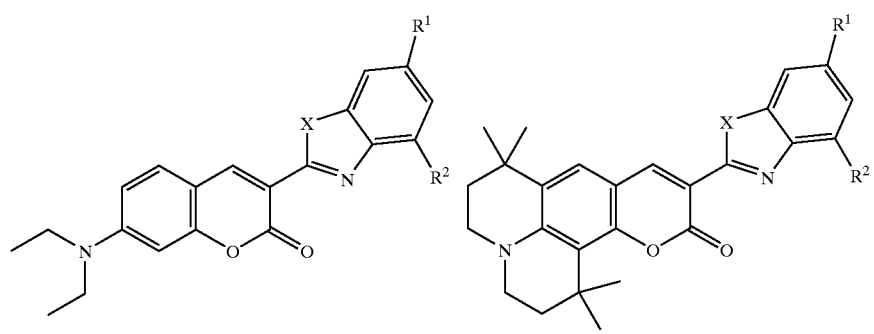

|     | X | R1     | R2     |     | X | R1     | R2     |
|-----|---|--------|--------|-----|---|--------|--------|
| L9  | O | H      | H      | L23 | O | H      | H      |
| L10 | O | H      | Methyl | L24 | O | H      | Methyl |
| L11 | O | Methyl | H      | L25 | O | Methyl | H      |
| L12 | O | Methyl | Methyl | L26 | O | Methyl | Methyl |
| L13 | O | H      | t-butyl| L27 | O | H      | t-butyl|
| L14 | O | t-butyl| H      | L28 | O | t-butyl| H      |
| L15 | O | t-butyl| t-butyl| L29 | O | t-butyl| t-butyl|
| L16 | S | H      | H      | L30 | S | H      | H      |
| L17 | S | H      | Methyl | L31 | S | H      | Methyl |
| L18 | S | Methyl | H      | L32 | S | Methyl | H      |
| L19 | S | Methyl | Methyl | L33 | S | Methyl | Methyl |
| L20 | S | H      | t-butyl| L34 | S | H      | t-butyl|
| L21 | S | t-butyl| H      | L35 | S | t-butyl| H      |
| L22 | S | t-butyl| t-butyl| L36 | S | t-butyl| t-butyl|

|     | R       |     | R       |
|-----|---------|-----|---------|
| L37 | phenyl  | L41 | phenyl  |
| L38 | methyl  | L42 | methyl  |
| L39 | t-butyl | L43 | t-butyl |
| L40 | mesityl | L44 | mesityl |

-continued

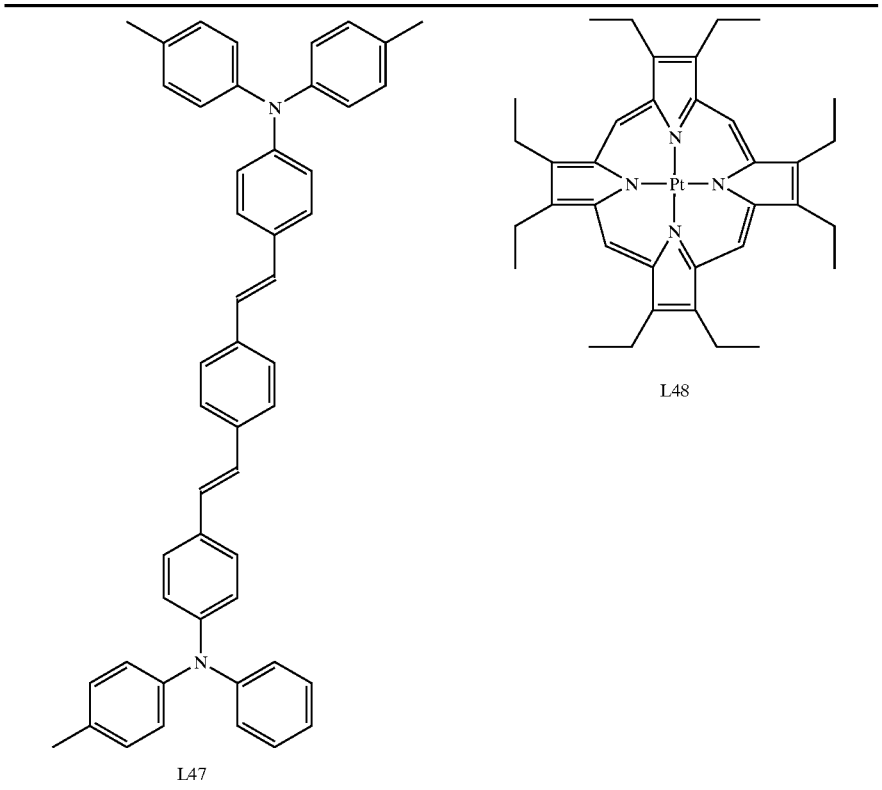

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al in commonly assigned U.S. Pat. No. 6,194,119 B1 and references therein.

A significant problem is to ensure that beam of light 24 properly irradiates donor element 16 so that emissive material 22 is transferred to the pixel portions 12, and not to the intervening portions 14. Since the distance between pixel portions 12 can be less than 100 micrometers, this can be a significant problem. Minor errors in placement of the substrate 10, both laterally and angularly, as well as thermal expansion effects from changes in the ambient temperature, can negatively affect the alignment of laser radiation and pixel portions. The misalignment results in higher defect rates in production or in lower-quality devices. It is a significant problem to maintain the alignment of the beam of light and the substrate due to the aforementioned alignment factors.

Figure 4A:
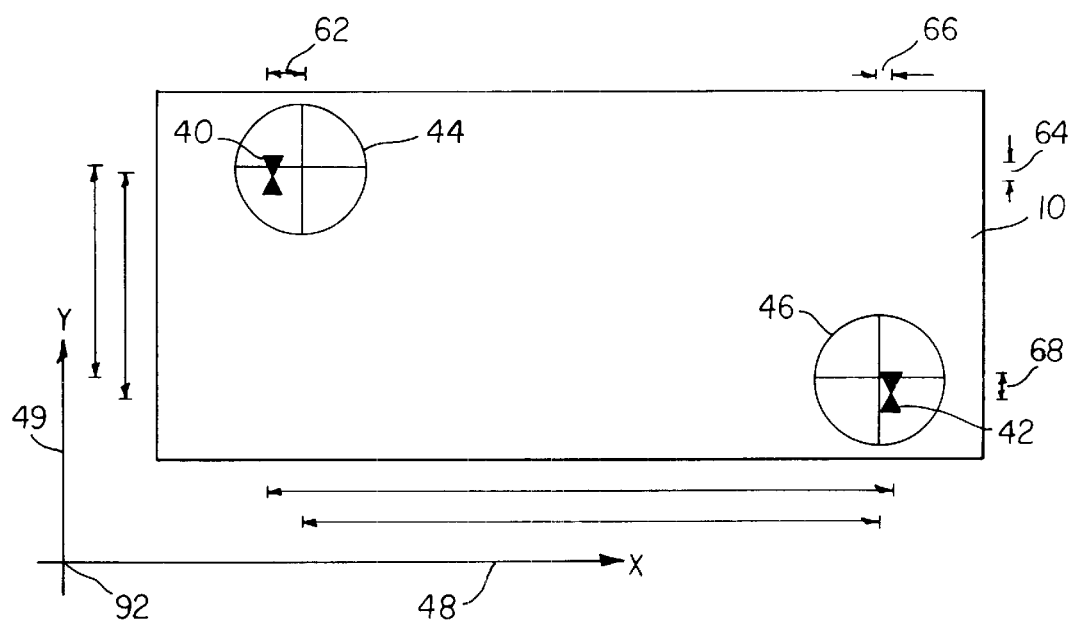
FIG. 4a shows a substrate with discernible features and with camera crosshairs shown, and also shows various dimensional offsets.

FIG. 4a shows a substrate with discernible features and with camera crosshairs shown and also shows various dimensional offsets. It will be understood that FIG. 4a is drawn for clarity of illustration, and that camera crosshairs 44 and 46 will only be visible in the camera systems and not on substrate 10, and that only the portion of substrate 10 within the crosshairs will be seen through such a camera system. An x-y coordinate system 92 can be defined by x direction 48 and y direction 49 through precision metering devices which govern the motion of the radiation source during fabrication of the devices. The camera crosshairs are described in this coordinate system with x and y coordinates, namely $x_{c1}$, $y_{c1}$, for camera crosshairs 44 and $x_{c2}$, $y_{c2}$ for camera crosshairs 46. These locations can be established through a system calibration procedure where the cameras are located within the x-y coordinate system. The steps of this procedure will become evident in this description.

Definition of substrate 10 misalignment within x-y coordinate system 92 relies on defining the positions of the discernible features, i.e. fiducial marks 40 and 42, relative to camera crosshairs 44 and 46. Camera crosshairs 44 is offset from fiducial mark 40 by $\Delta x_1$ 62 and $\Delta y_1$ 64. Camera crosshairs 46 is offset from fiducial mark 42 by $\Delta x_2$ 66 and $\Delta y_2$ 68. The positions of the fiducial marks in x-y coordinate system 92 are calculated from the known position of the camera crosshairs and the offsets between the crosshairs and the corresponding substrate fiducial marks. The calculated positions can be described by their x and y coordinates: fiducial mark 40 is at position $x_{f1}$, $y_{f1}$ and fiducial mark 42 is at $x_{f2}$, $y_{f2}$.

Figure 4B:
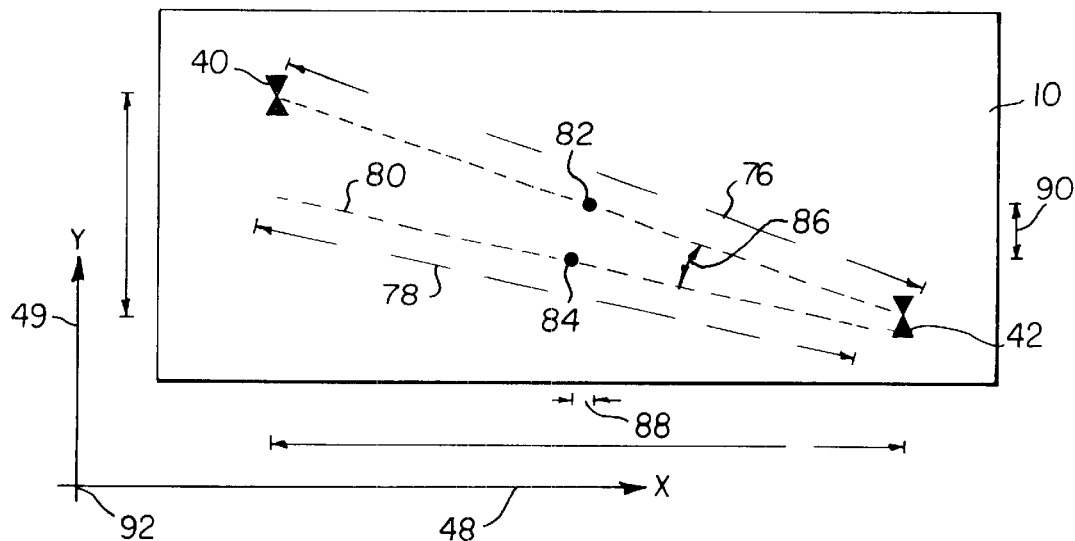
FIG. 4b shows the locations of the line defined by discernible features and a comparison with a nominal line.

Turning now to FIG. 4b, we see the locations of the line defined by discernible features and a comparison with a nominal line. Detected line 74 is defined by its endpoints, that is by fiducials 40 and 42. The actual length 76 of detected line 74 can be computed and represents the actual spacing between the two discernible features. Nominal line 80 possesses a nominal length 78 which represents the nominal spacing between the two discernible features. Nominal line 80 and its dimensions have been previously determined from a known substrate 10 under predetermined conditions. The ratio of actual length 76 of detected line 74 and nominal length 78 is a measure of dimensional changes and is referred to as the magnification of substrate 10. This ratio can also be called a correction factor. Substrate 10 is assumed to expand uniformly. The offset between detected midpoint 82 of detected line 74 and target midpoint 84 of nominal line 80 would represent the lateral offset of $\Delta x_L$ 88 and $\Delta y_L$ 90. The angle of detected line 74 relative to the angle of nominal line 80 defines the angular offset 86 of substrate 10.

A lateral shift of $\Delta x_L$ 88 and $\Delta y_L$ 90 and an angular shift by an amount equivalent to the angular offset 86 can be applied to the substrate, to the transport system that holds the print head, or to the image data to be printed, any of which will correct for the angular and lateral offsets. The degree of correction will depend upon the accuracy and precision of the system providing this relative motion. The errors associated with the magnification due to thermal expansion can be corrected during the creation of the image file or during printing; the latter being referred to as dynamic correction. In the dynamic correction embodiment, the error due to the magnification of the substrate is accounted for in the triggering of the radiation source.

Figure 5:
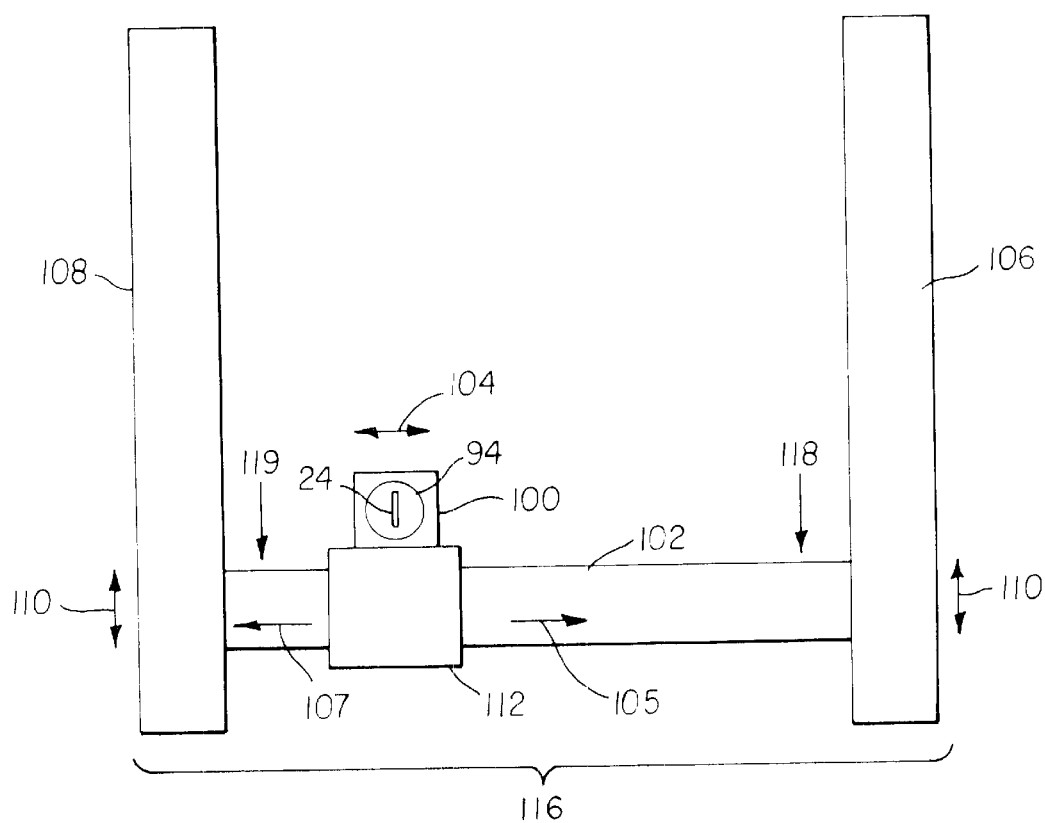
FIG. 5 shows one embodiment of a transport apparatus of a movable light source and micropositioning devices which enables the method described herein.

Turning now to FIG. 5 and referring also to FIG. 4a, there is shown one embodiment of a transport apparatus 116 including a movable light source and micropositioning devices which enables the method described herein. Transport apparatus 116 includes the apparatus to move beam of light 24 by moving light source 100, that is, micropositioning devices 102, 106, and 108, and carriage 1 12. This apparatus has been described by Kay, et al in above-cited commonly assigned U.S. patent application Ser. No. 10/055,579, the disclosure of which are incorporated by reference.

Light source 100 is transversely and angularly movable to selected positions to change the relative location of beam of light 24 in a manner which will now be described. Movable light source 100 is mounted on micropositioning device 102. Light source 100 can be, for example, a laser printhead as taught by Kay et al in above-cited commonly assigned U.S. patent application Ser. No. 10/055,579. Micropositioning device 102 is capable of moving and locating light source 100 in transverse direction 104 with a resolution on the order of sub-micrometers. Micropositioning device 102 is commercially available from manufacturers such as Dover Instruments Corp. Carriage 112 represents the movable portion of micropositioning device 102. Micropositioning device 102 can adjust for lateral displacement in one direction, for example x direction 48 in FIG. 4b, thus making light source 100 transversely movable to adjust the position of light source 100 in relation to substrate 10 and donor element 16, which are in a transfer relationship to each other.

Micropositioning device 102 is mounted to micropositioning device 106 and micropositioning device 108. The latter two are similar to, but arranged in a manner orthogonal to micropositioning device 102, and are thus capable of moving each end of micropositioning device 102 in perpendicular direction 1 10. Micropositioning device 106 and micropositioning device 108 can be moved in unison to adjust for lateral displacement in a direction orthogonal to that of micropositioning device 102, e.g. y direction 49 in FIG. 4b. The mechanical couplings between micropositioning devices 106, 108, and 102 also allow limited angular adjustment within the plane defined by transverse direction 104 and perpendicular direction 110. That is, micropositioning devices 106 and 108 can be moved in opposite directions to adjust for angular error 86, thus angularly moving light source 100 and beam of light 24.

Figure 6:
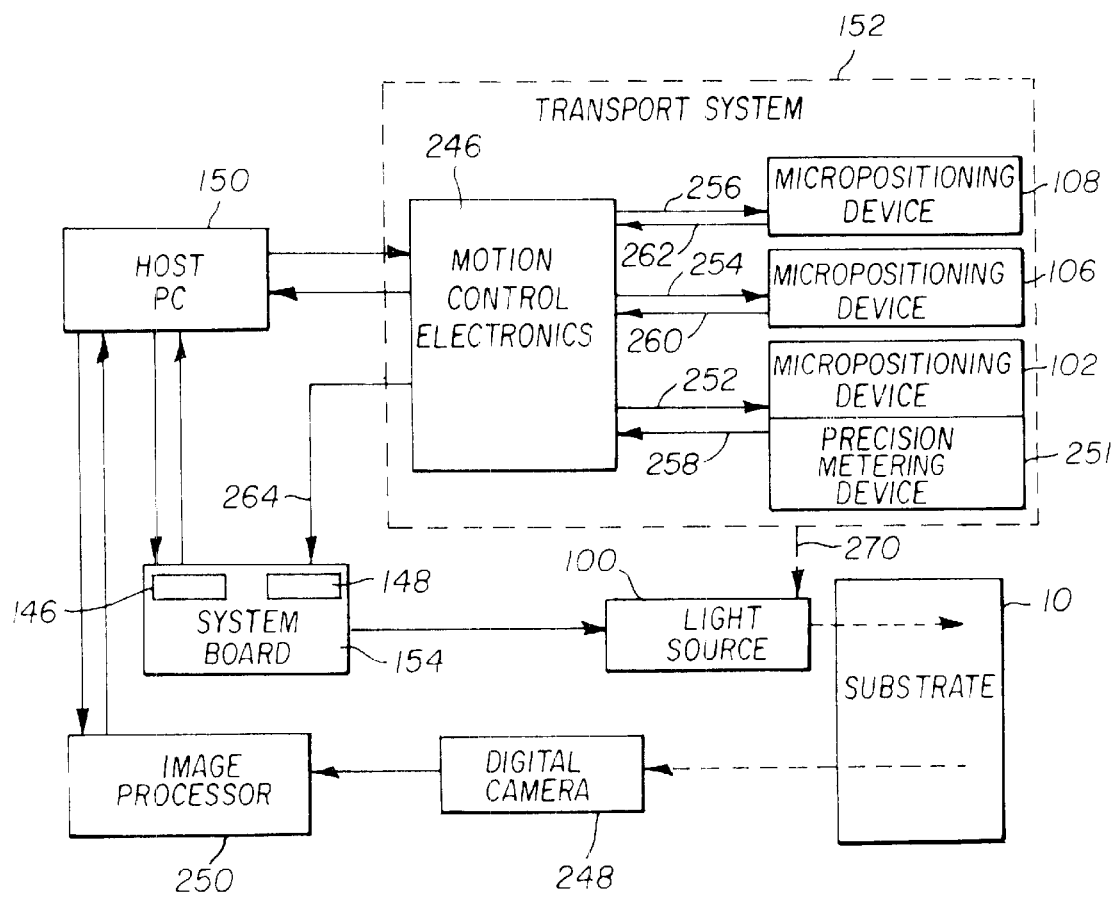
FIG. 6 is a block diagram of the electro-optical subsystems which are used to accomplish the detection of the camera positions, the detection of the discernible features, and the correction of the misalignment.

FIG. 6 shows a block diagram of the electro-optical subsystems hich are used to accomplish the detection of the camera positions, the detection of the fiducials, and the correction of the misalignment. Transport system 152 includes motion control electronics 246 and micropositioning devices 102, 106, and 108. Micropositioning devices 102, 106, and 108 control the movement and position of light source 100. This control is here symbolized by connection 270. Drive signals 252, 254, and 256 from motion control electronics 246 control the movement of micropositioning devices 102, 106, and 108, respectively, and thereby the movement of light source 100. Precision feedback signals 258, 260, and 262 allow motion control electronics 246 to monitor the positions of micropositioning devices 102, 106, and 108, respectively, and thereby the position of light source 100. Such feedback signals can comprise predetermined pulses determined by the positions or movement of the respective micropositioning devices as light source 100 is moved. Predetermined pulses can be e.g. pulse trains where a pulse is generated as the respective micropositioning devices is moved by a predetermined distance. Such pulses can be generated by precision metering devices, such as a linear encoder or laser interferometer, or any other precision metering devices well known in the art. Such precision metering devices can be a part of micropositioning devices, e.g. precision metering device 251 can be a part of or can be attached to micropositioning device 102. Precision metering device 251 can include one or more precision sensors capable of defining the position of light source 100. Such precision sensors can also define an x-y coordinate system 92.

The system can include one or more detectors, e.g. digital cameras 248, which are designed to detect discernible features, e.g. the image of fiducial marks 40 and 42 on substrate 10 and which optionally can have a predetermined x-y viewing coordinate system. Digital cameras 248 produce a digital image which is correlated with the x-y viewing coordinate system. Digital image data can be transferred to image processor 250, which includes a processing algorithm for processing such digital image data and which can compute the locations of fiducial marks 40 and 42 relative to the centers of the respective digital cameras 248. Digital cameras 248 can be calibrated so that image processor 250 is able to report positions in predetermined x-y coordinate system 92. Digital cameras 248 are also capable of viewing and reporting to image processor 250 the location of beam of light 24 on substrate 10.

Data describing the location of fiducial marks 40 and 42 relative to the center of respective digital cameras 248 can be transferred from image processor 250 to host PC 150, which can use that information to compute the lateral and angular offsets as well as the magnification of substrate 10. Host PC 150 can instruct motion control electronics 246 to move micropositioning devices 102, 106, and 108, and thus light source 100, to any desired position, and can monitor such movement and position by feedback from motion control electronics 246. Motion control electronics 246 is programmed to accept an angular offset, such as angular error 86, as an input from host PC 150 and to maintain it until directed to remove the angular offset. In addition, motion control electronics 246 is programmed to accept lateral offset correction signals from host PC 150 to adjust micropositioning devices 102, 106, and 108 such that the appropriate drive signals are generated during the exposure of the substrate. By such control, host PC 150 can instruct motion control electronics 246 to adjust the starting position and angular offset of light source 100 based on data from image processor 250. Host PC 150 can also instruct motion control electronics 246 that light source 100 is to be scanned for the transfer of emissive material to the substrate. System board 154 also can include count register 146 and error accumulator 148, which can be used in controlling the driving of light source 100.

During the motion required for the transfer of emissive material to the substrate, micropositioning devices 102, 106 and 108 are controlled by the motion control electronics 246 which generates drive signals 252, 254 and 256 and monitors precision feedback signals 258, 260 and 262 from micropositioning devices 102, 106 and 108 respectively. Closed loop control in motion control electronics 246 can generate drive signals 252, 254, and 256 so that desired values of feedback signals 258, 260 and 262 are attained. Further, if the current values of feedback signals 258, 260 and 262 deviate from the desired values, a correction can be made continuously through drive signals 252, 254 and 256 in order to maintain the desired position. During exposure of a device, the Motion Control Electronics 246 can continually update the desired position in such a way that micropositioning devices 102, 106 and 108 are commanded to scan the printing area in a raster fashion.

Also, during scanning and exposure of a device, system board 154 appropriately drives light source 100. System board 154 directs light source 100 to emit light or not emit light based upon image data received from host PC 150 and dynamic correction signals 264 received from motion control electronics 246. Dynamic correction signals 264 can include repeating signals such as encoder pulses and non-repeating signals such as trigger signals. As stated, during the exposure of a device motion control electronics 246 controls the movement of light source 100 such that it traverses the printing area in a raster fashion.

It will be clear to those skilled in the art that other means of providing relative movement between beam of light 24 and substrate 10 are possible. For example, light source 100 can be fixed. Such relative movement can then be provided by moving substrate 10. Alternatively, an arrangement of mirrors or gratings can provide relative movement by changing the location at which beam of light 24 impinges on substrate 10.

Figure 7:
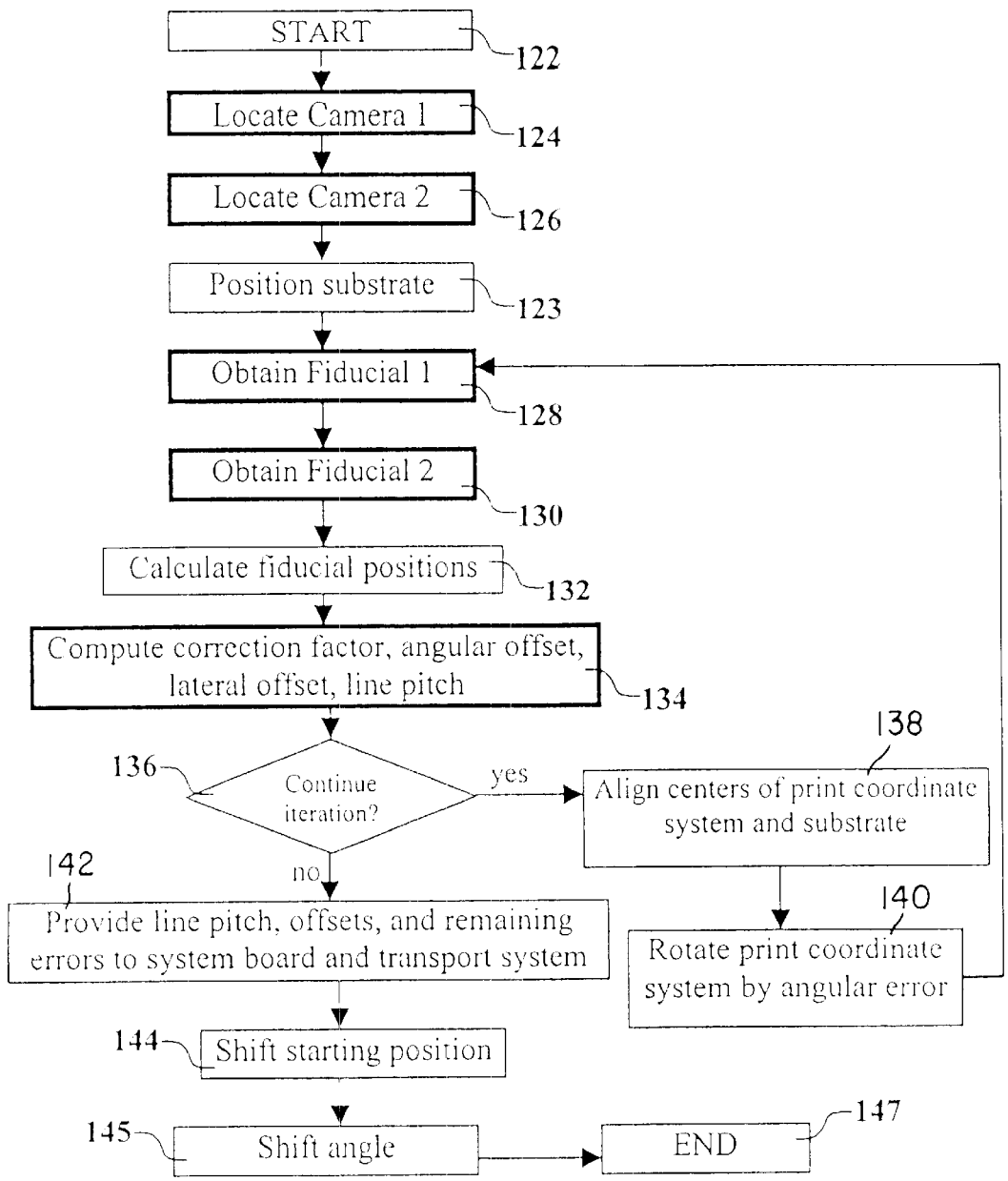
FIG. 7 is a block diagram showing the overall steps involved in aligning the substrate and the transport system.

Turning now to FIG. 7, and referring also to FIGS. 4a and 4b, we see the overall steps involved in the substrate alignment process, that is aligning the substrate and the transport system. Steps in FIG. 7 that are actually multiple steps have bold outlines, as shown in the Legend, and will be further discussed in other figures. At the start of the process (Step 122), the system locates camera one, that is, it locates the position of crosshairs 44, in x-y coordinate system 92 (Step 124, which can be called a camera location process). The system then locates camera two, that is, it locates the position of crosshairs 46, in x-y coordinate system 92 (Step 126, which can be called a camera location process). Next, donor element 16 and substrate 10 are placed into the system (step 123). Substrate 10 is positioned relative to digital camera(s) 248 so that digital camera(s) 248 can produce a digital image having fiducial marks 40 and 42 properly located for processing, the nature of which will become evident. By properly located, we mean that the discernible features are located within the field of view of digital camera(s) 248 and preferably within the center 20% of the image. The system then obtains the offset of first fiducial mark 40 relative to crosshairs 44 (Step 128, which can be called a fiducial location process) and the offset of second fiducial mark 42 relative to crosshairs 46 (Step 130, which can be called a fiducial location process). The system thus detects the location of the discernible features on substrate 10 relative to x-y coordinate system 92. Host PC 150 calculates the positions of fiducial marks 40 and 42 in x-y coordinate system 92 (Step 132), then the thermal-expansion-compensation algorithm compares actual spacing 76 between two discernible features and nominal spacing 78 and produces a correction factor, which is the ratio of actual spacing 76 and nominal spacing 78. The system then computes the angle, and center of substrate 10 (Step 134). The system thus determines the position and orientation of substrate 10 relative to beam of light 24.

If desired this can be done in an iterative process. In this case the Motion Control Electronics will actually command motion by the supplied lateral and angular offsets and the calculation of these offsets will be repeated. For example, if iterative is selected (Step 136), the system aligns the center of x-y coordinate system 92 with detected midpoint 82 (Step 138), and then angularly moves beam of light 24 by applying an angular alignment correction of angular error 86 to x-y coordinate system 92 (Step 140) by host PC 150 sending a signal to motion control electronics 246, the signal representing the necessary offsets of micropositioning devices 106 and 108 needed to institute an angular correction. Steps 128 to 134 can be repeated for further refinement.

An iterative process will not be necessary if the images of fiducial marks 40 and 42 are of sufficient quality and micropositioning devices 102, 106, and 108 and associated precision metering devices have sufficient ability to measure and control position such that a single set of measurements provides positioning information within the error margins necessary to properly deposit the emissive layers on the OLED substrate.

After the final iterative pass, or if an iterative process is not used (Step 136), the system provides the correction factor and remaining lateral and angular offsets to the system board and transport system (Step 142) then makes a final adjustment to the starting position (step 144) and the angle (step 145) before the process ends (step 147). Some of these steps will be further detailed in the figures and description which follow.

Figure 8:
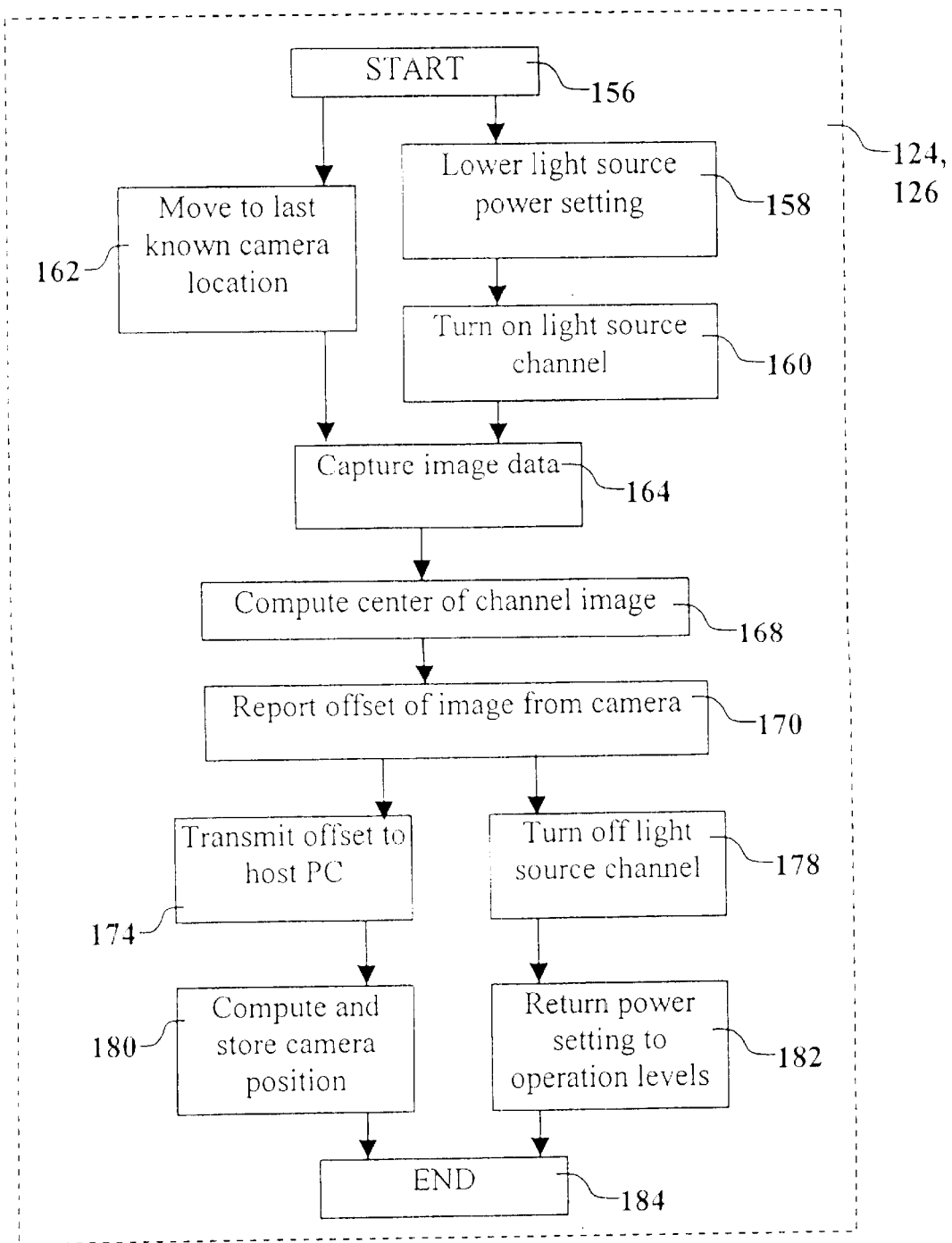
FIG. 8 is a block diagram showing in greater detail the steps involved in locating the camera relative to the light source in the x-y coordinate system in this process.

Turning now to FIG. 8, and referring also to FIG. 6, we see in greater detail the steps involved in the camera location process in the x-y coordinate system, that is steps 124 and 126 in FIG. 7. These steps rely upon a procedure where beam of light 24 is moved into each camera's field of view. At the start of this process (step 156), host PC 150 commands the other systems. Host PC 150 commands system board 154 to lower the operating power of light source 100 from its normal writing power to a lower power that is sufficient for locating the illumination position of beam of light 24 (step 158). If light source 100 is a multichannel light source, host PC 150 commands system board 154 to turn on a single channel of light source 100 (step 160). Host PC instructs motion control electronics 246 to move light source 100 via micropositioning devices 102, 106, and 108 to the last known camera center location (step 162). The last known camera center location is the position of the light source that would have placed it at the camera center the last time that the camera location process was performed. If no camera location process was previously performed, a manual location process may be necessary to establish an initial last known camera center location. Step 162 can occur before, during, or after steps 158 and 160. Step 162 effectively positions beam of light 24 relative to digital camera 248 so that digital camera 248 can produce a digital image having the emitted light properly located for processing, the nature of which will become evident. By properly located, we mean that the emitted light is located within the field of view of digital camera(s) 248 and preferably within the center 20% of the image.

Host PC 150 then commands image processor 250 to capture image data from digital camera(s) 248 (step 164). Image processor 250 automatically computes the center of mass of the channel image emitted by light source 100 (step 168) and then reports to host PC 150 the offset in x and y from the center of the camera to the center of mass of the channel image (step 170). The position of beam of light 24 can be known from e.g. the above positioning process, or by transport system 152 transferring the position data to host PC 150. The positions of digital camera 248 and beam of light 24 are known in x-y coordinate system 92 and thus the position of the digital camera 248 relative to the current position of beam of light 24 is also known.

Once the image data is captured, computed, and the offsets reported, host PC 150 transmits to transport system 152 the offset in x and y from the center of the camera to the center of mass of the channel image (step 174). Transport system 152, and specifically motion control electronics 246, computes and stores the current camera position (step 180) in the x-y coordinate system 92 as the last known camera position. Concurrently, host PC 150 instructs system board 154 to turn off the channel of light source 100 (step 178) and to return the power setting of light source 100 to normal writing levels (step 182). The process then ends (step 184), which can include a ready signal from either system board 154 or transport system 152 or both to host PC 150.

This process is repeated for the second and any subsequent camera systems such that the position of the camera crosshairs are known in the x-y coordinate system 92.

Figure 9:
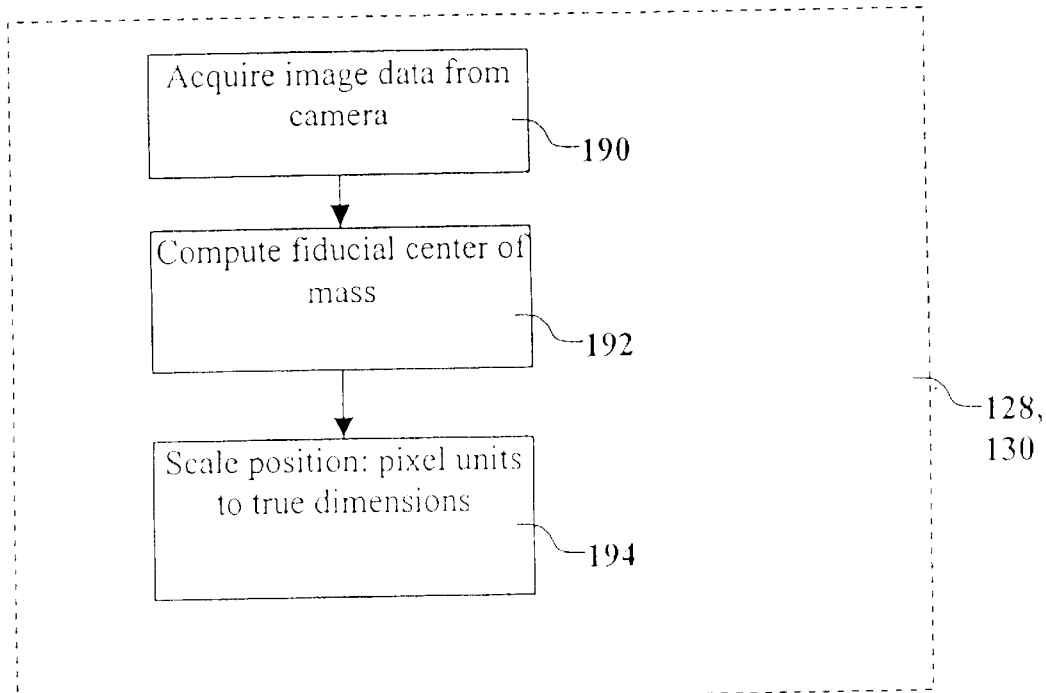
FIG. 9 is a block diagram showing in greater detail some of the steps involved in obtaining the fiducial offset in this process.

Turning now to FIG. 9 and referring also to FIG. 1a and FIG. 6, we see a block diagram showing in greater detail some of the steps involved in the fiducial location process, that is, in detecting the location of the discernible feature on substrate 10 relative to the detecting camera. FIG. 9 is therefore a more detailed view of steps 128 and 130 in FIG. 7 and is a processing algorithm for processing the digital image of a discernible feature. In step 190, image processor 250 acquires image data from digital camera 248, which includes the area within crosshairs 44 or 46 in FIG. 1a and includes a fiducial mark (40 or 42). Image processor 250 uses the image data to compute the center of mass of the fiducial mark (step 192). Image processor 250 then converts the fiducial mark position from camera system pixel units into actual dimensions and thus defines the location of the fiducial mark center, and therefore the position and orientation of substrate 10, relative to x-y coordinate system 92 (step 194). In doing so, the position and orientation of substrate 10 relative to beam of light 24 can be determined.

Figure 10:
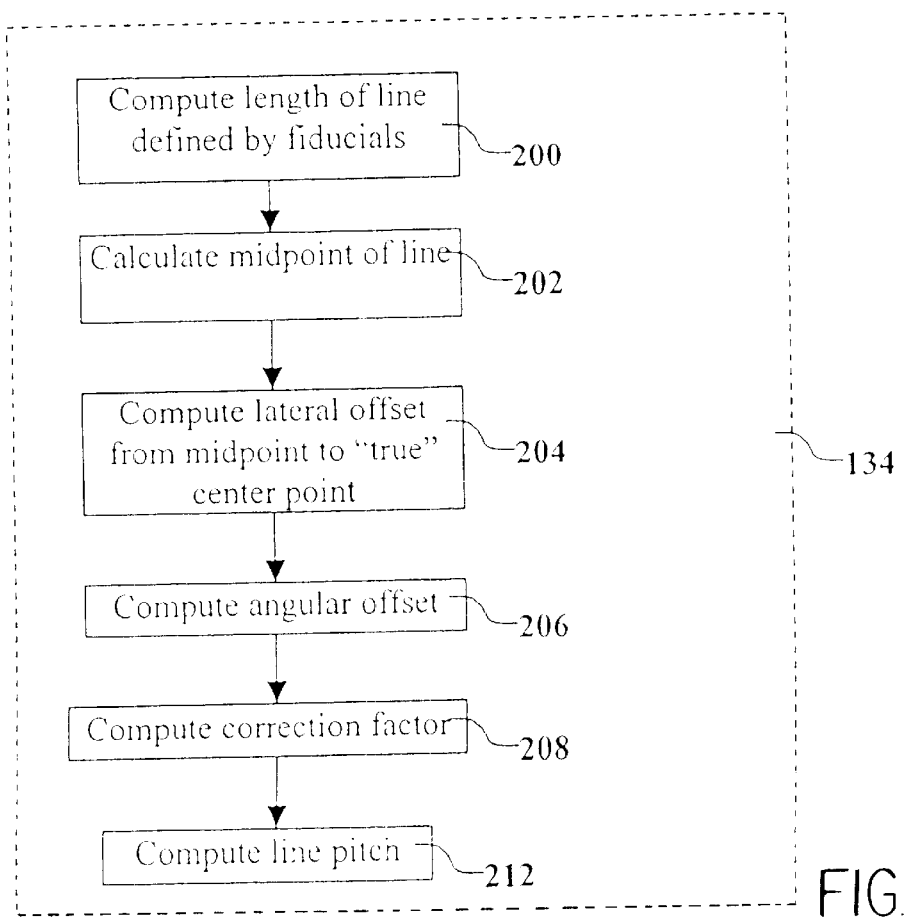
FIG. 10 is a block diagram showing in greater detail some of the steps involved in calculating some of the important parameters in this process.

Turning now to FIG. 10, and referring also to FIG. 4b, FIG. 5, and FIG. 6, we see a block diagram showing in greater detail some of the steps involved in calculating some of the important parameters in this process. FIG. 10 is therefore a more detailed view of step 134 in FIG. 7. In step 200, host PC 150 computes the length of detected line 74, which is defined by the two points located at the center of mass of fiducial marks 40 and 42, where the positions are expressed within x-y coordinate system. Midpoint 82 is then calculated (step 202) and the lateral offset from the desired midpoint 84 is calculated by host PC 150 (step 204). Host PC 150 computes angular offset 86 between lines 74 and 80 (step 206). The results are the angular offset 86 and the lateral offset, represented by $\Delta x_L$ 88 and $\Delta y_L$ 90. In step 208, host PC 150 computes the correction factor, i.e. the ratio of the length of line 74 to the length of line 80. Host PC 150 then computes the actual line pitch from the nominal line pitch and the magnification (step 212).

Now the discussion must move to the construction of an image file for the fabrication of an OLED device. The image file is a data file containing values for each pixel portion to be written. In the systems current state each channel can be either on or off. The term "channel" refers to a single channel of a multichannel light source, as described by Kay et al in above-cited commonly assigned U.S. patent application Ser. No. 10/055,579. This image data is organized into strips referred to as swaths. Depending on the desired image, the swaths are configured to have specific lengths and widths. To coordinate the exposure of this image in registration with the patterned substrate requires first that the substrate be aligned with the x-y coordinate system and then requires that host PC 150 and transport system 152 provide several pieces of information to the system board 154. First the system board 154 must have the format of the image and the line pitch. It also needs to have the remaining angular offset of the substrate relative to the x-y system. It also needs to have information related to the distance traveled along the swath during the writing process, which is also referred to as metering information.

Figure 11:
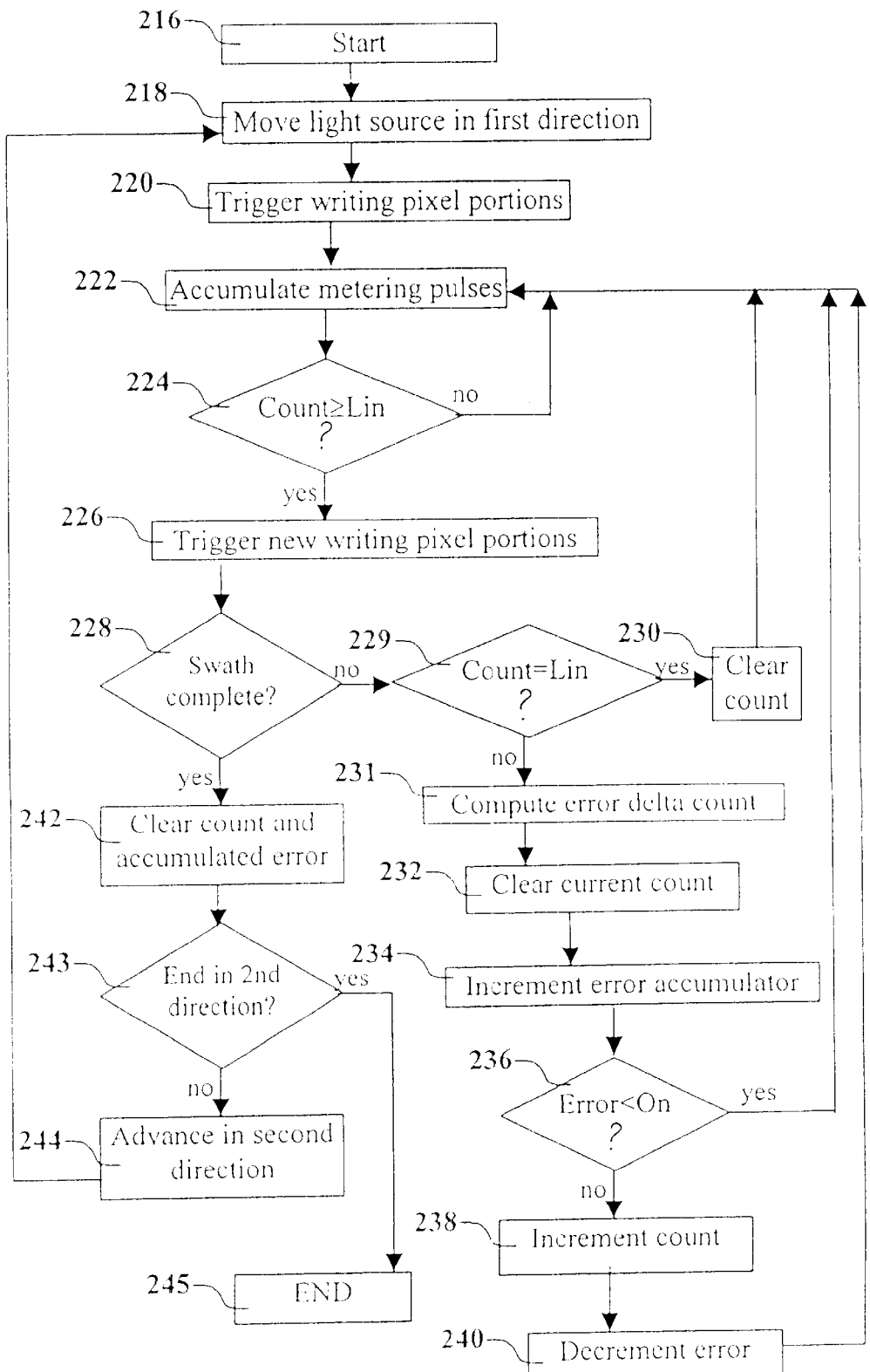
FIG. 11 is a block diagram showing the steps in the writing process, including dynamic alignment for magnification adjustment.

Turning now to FIG. 11, and referring also to FIG. 3b, FIG. 5, and FIG. 6, we see a block diagram showing the steps in the writing process, including dynamic alignment for magnification adjustment, also known as a thermal-expansion-compensation algorithm. During the writing process, the transversely moving light source 100 is actuated in accordance with the detected position and orientation of the substrate by changing the timing of actuation of light source 100 as it is moved to different transverse positions. Actuating light source 100 actuates beam of light 24. In this manner, beam of light 24 illuminates different portions of donor element 16 and in such a process deposits a plurality of emissive layers, e.g. emissive layers 32 and 33, onto substrate 10. Metering information allows the system board 154 to compensate for the thermal expansion of the substrate 10. In addition, since the resolution of the metering information and the pitch of the pixel sites may not be synchronized or of the same resolution a thermal-expansion compensation algorithm for tracking and compensating for accumulated error must be included.

At the start (Step 216), light source 100 is moved in a first direction, for example first transverse direction 105, by micropositioning device 102 (step 218). This moves beam of light 24 in the first direction. Micropositioning device 102 signals motion control electronics 246 as to its position, for example by precision feedback signal 258 comprising predetermined pulses from precision metering device 251, that is, pulses generated as the light source 100 is moved by a predetermined distance. The thermal-expansion-compensation algorithm uses the pulses of the precision-feedback signal 258 to correctly actuate transversely moving light source 100. At a predetermined point, transport system 152 triggers system board 154 via correction signal 264 to begin the writing process (step 220). Motion; control electronics 246 sends the metering pulses to system board 154, which accumulates the pulses in count register 146 (step 222). The thermal-expansion-compensation algorithm compares the accumulated pulses, which are a measure of distance, to the line pitch, which is the nominal spacing of pixel portions 12 modified by the correction factor, which has been defined as the ratio of actual spacing 76 and nominal spacing 78. If the accumulated count is less than the line pitch (step 224), system board 154 continues to accumulate metering pulses in count register 146 (step 222). If the accumulated count is equal to or greater than the line pitch (step 224), the writing of the next set of predetermined pixel portions is triggered (step 226). If the swath is not complete (step 228), that is if there are additional pixel portions to be written in the first direction, the count is compared to the line pitch (step 229). If the count is equal to the line pitch, the count in count register 146 is cleared by system board 154 (step 230) and the process of writing and accumulating metering pulses is continued.

If the count is not equal to the line pitch, that is if the count is greater than the line pitch, this error must be accumulated. The error in the count is computed (step 231), the count in count register 146 is cleared (step 232), and error register 148 is incremented by the computed error (step 234). If the accumulated error in error register 148 is less than one (step 236), system board 154 restarts the process of accumulating metering pulses in count register 146 (step 222). If the accumulated error is greater than or equal to one, the count in 10 count register 146 is incremented by the integer part of the value in error register 148 (step 238) and the accumulated error in error register 148 is decremented by the same amount (step 240). System board 154 then restarts the process of accumulating metering pulses in count register 146 (step 222).

If the swath that was being printed is complete (step 228), that is, if light source 100 has reached first end point 118, system board 154 clears the count in count register 146 and the accumulated error in error register 148 (step 242). If the end of writing has been reached in second or perpendicular direction 110 (step 243), that is if the entire surface has been written to, the process stops (step 245).

If there are additional swaths to be written, light source 100 is advanced in the second direction, for example micropositioning devices 106 and 108 move light source 100 in perpendicular direction 110 (step 244). The process of moving light source 100 in transverse direction 104 and irradiating predetermined pixel portions is then repeated, starting from step 218. The movement of light source 100 can be in the opposite direction of the previous swath, that is in second transverse direction 107 parallel to but opposite to first transverse direction 105, to second end point 119, which is bi-directional irradiation. In an alternative embodiment, light source 100 can be moved to starting point 119 before irradiation and the irradiation effected in first transverse direction 105, thus effecting uni-directional irradiation.

It will be clear that this process can be repeated with different donor elements 16 to produce e.g. a color OLED device comprising different color emissive layers that produce different colored light. For example, a first donor element 16 can be illuminated to deposit a plurality of emissive layers of a first colored light, e.g. red. A second donor element 16 can be illuminated to deposit a plurality of emissive layers of a second colored light, e.g. green. A third donor element 16 can be illuminated to deposit a plurality of emissive layers of a third colored light, e.g. blue. Each emissive layer is deposited relative to the corresponding electrodes, e.g. pixel portions 12 on substrate 10.

The invention has been described in detail with particular reference to certain preferred embodiments thereof, but it will be understood that variations and modifications can be effected within the spirit and scope of the invention. For example, other arrangements for thermal transfer can be used that would depend upon precision alignment between the substrate and the thermal transfer.

PARTS LIST

| | |
|---|---|
| 10 | substrate |
| 10a | misaligned substrate |
| 10b | misaligned substrate |
| 10c | misaligned substrate |
| 12 | pixel portion |
| 12a | first pixel portion |
| 12b | second pixel portion |
| 12c | third pixel portion |
| 14 | intervening portion |
| 16 | donor element |
| 18 | support |
| 20 | energy-absorbing layer |
| 22 | emissive material |
| 24 | beam of light |
| 26 | non-transfer surface |
| 28 | transfer surface |
| 32 | emissive layer |
| 32a | blue-emitting emissive layer |
| 32b | green-emitting emissive layer |
| 32c | red-emitting emissive layer |
| 33 | emissive layer |
| 40 | fiducial mark |
| 42 | fiducial mark |
| 44 | crosshairs |
| 46 | crosshairs |
| 48 | x direction |
| 49 | y direction |
| 50 | pixel portion |
| 51 | corner |
| 52 | pixel portion |
| 53 | corner |
| 62 | $\Delta x_1$ |
| 64 | $\Delta y_1$ |
| 66 | $\Delta x_2$ |
| 68 | $\Delta y_2$ |
| 74 | detected line |
| 76 | actual spacing or actual length |
| 78 | nominal spacing or nominal length |
| 80 | nominal line |
| 82 | detected midpoint |
| 84 | target midpoint |
| 86 | angular offset |
| 88 | $\Delta X_L$ |
| 90 | $\Delta Y_L$ |
| 92 | x-y coordinate system |
| 94 | lens |
| 96 | pressurizing means |
| 98 | secured substrate/donor element |
| 100 | light source |
| 102 | micropositioning device |
| 104 | transverse direction |
| 105 | first transverse direction or first direction |
| 106 | micropositioning device |
| 107 | second transverse direction or second direction |
| 108 | micropositioning device |
| 110 | perpendicular direction |
| 112 | carriage |
| 116 | transport apparatus |
| 118 | first end point |
| 119 | second end point or starting point |
| 122 | block |
| 123 | block |
| 124 | camera location process |
| 126 | camera location process |
| 128 | fiducial location process |
| 130 | fiducial location process |
| 132 | block |
| 134 | block |
| 136 | block |
| 138 | block |
| 140 | block |
| 142 | block |
| 144 | block |
| 145 | block |
| 146 | count register |
| 147 | block |
| 148 | error accumulator |
| 150 | host PC |
| 152 | transport system |
| 154 | system board |

-continued

PARTS LIST

| | |
|---|---|
| 156 | block |
| 158 | block |
| 160 | block |
| 162 | block |
| 164 | block |
| 168 | block |
| 170 | block |
| 174 | block |
| 178 | block |
| 180 | block |
| 182 | block |
| 184 | block |
| 190 | block |
| 192 | block |
| 194 | block |
| 200 | block |
| 202 | block |
| 204 | block |
| 206 | block |
| 208 | block |
| 212 | block |
| 216 | block |
| 218 | block |
| 220 | block |
| 222 | block |
| 224 | block |
| 226 | block |
| 228 | block |
| 229 | block |
| 230 | block |
| 231 | block |
| 232 | block |
| 234 | block |
| 236 | block |
| 238 | block |
| 240 | block |
| 242 | block |
| 243 | block |
| 244 | block |
| 245 | block |
| 246 | motion control electronics |
| 248 | digital camera |
| 250 | image processor |
| 251 | precision metering device |
| 252 | drive signal |
| 254 | drive signal |
| 256 | drive signal |
| 258 | feedback signal |
| 260 | feedback signal |
| 262 | feedback signal |
| 264 | correction signal |
| 270 | connection |

What is claimed is:

1. A method for depositing an emissive layer for use in an organic light-emitting display device (OLED), comprising the steps of:
   (a) providing an OLED substrate having at least two discernible fiducial marks which is usable for locating the position and orientation of the OLED substrate for properly depositing the emissive layer relative to pixel portions of the OLED substrate;
   (b) providing a light source that provides a beam of light which is transversely and angularly movable to selected positions to change the relative location of a beam of light produced by such source;
   (c) providing an unpatterned donor element including emissive material and having an energy-absorbing layer, arranged so that when the donor element is properly positioned relative to the OLED substrate, the beam of light can be absorbed by the energy-absorbing layer to heat the emissive material and cause the transfer of such emissive material to the OLED substrate;
   (d) positioning the donor element in a transfer relationship to the OLED substrate;
   (e) detecting the location of the discernible feature on the OLED substrate to determine the position and orientation of the OLED substrate relative to the light source; and
   (f) angularly moving the beam of light and then moving the beam of light in a first transverse direction until a first end point is reached and then moving the beam of light in a perpendicular direction and again transversely moving the beam of light in a second direction parallel to but opposite to the first direction to a second end point and actuating the transversely moving beam of light in the first or second directions or both directions in accordance with the detected position and orientation of the OLED substrate by changing the timing of such actuation as the beam of light is moved to different transverse positions.

2. The method of claim 1 further including using a thermal-expansion-compensation algorithm in step (f).

3. The method of claim 2 further including wherein the thermal-expansion-compensation algorithm compares the actual spacing between two discernible features to the nominal spacing to produce a correction factor.

4. The method of claim 3 further including providing three micropositioning devices for accomplishing step (f) and further including providing a precision metering device which provides predetermined pulses as the beam of light is moved in the first or second directions and wherein the thermal-expansion-compensation algorithm compares the number of pulses produced to the nominal spacing of the pixel portions modified by the correction factor to correctly actuate the beam of light.

5. A method for depositing an emissive layer for use in an organic light-emitting display device (OLED), comprising the steps of:
   (a) providing an OLED substrate having at least two discernible fiducial marks which is usable for locating the position and orientation of the OLED substrate for properly depositing the emissive layer relative to pixel portions of the OLED substrate;
   (b) providing a light source that provides a beam of light which is transversely and angularly movable to selected positions to change the relative location of a beam of light produced by such source;
   (c) providing precision sensors capable of defining the position of the light source and defining an x-y coordinate system;
   (d) providing an unpatterned donor element including emissive material and having an energy-absorbing layer, arranged so that when the donor element is properly positioned relative to the OLED substrate, the beam of light can be absorbed by the energy-absorbing layer to heat the emissive material and cause the transfer of such emissive material to the OLED substrate;
   (e) positioning the donor element in a transfer relationship to the OLED substrate;
   (f) detecting the location of the discernible feature on the OLED substrate to determine the position and orientation of the OLED substrate relative to the x-y coordinate system origin; and
   (g) angularly moving the beam of light and then moving the beam of light in a first transverse direction until a first end point is reached and then moving the beam of light in a perpendicular direction and again transversely moving the beam of light in a second direction parallel to but opposite to the first direction to a second end point and actuating the transversely moving beam of light in the first or second directions or both directions in accordance with the detected position and orientation of the OLED substrate by changing the timing of such actuation as the beam of light is moved to different transverse positions.

6. The method of claim 5 further including using a thermal-expansion-compensation algorithm in step (g).

7. The method of claim 5 wherein step (f) is provided by a digital camera having a predetermined x-y viewing coordinate system for producing a digital image which is correlated with the x-y viewing coordinate system and a processing algorithm for processing such digital image.

8. The method of claim 7 further including the step of positioning the OLED substrate relative to the digital camera so that the digital camera can produce a digital image having the fiducial marks properly located for processing.

9. The method of claim 6 further including wherein the thermal-expansion-compensation algorithm compares the actual spacing between two discernible features to the nominal spacing to produce a correction factor.

10. The method of claim 9 further including providing three micropositioning devices for accomplishing step (g) and further including providing a precision metering device including the precision sensors which provides pulses as the beam of light is moved in the first or second directions by a predetermined distance and wherein the thermal-expansion-compensation algorithm compares the number of pulses produced to the nominal spacing of the pixel portions modified by the correction factor to correctly actuate the beam of light.

11. A method for sequentially depositing different colored emissive layers which produce different-colored light for use in an organic light-emitting display device (OLED), comprising the steps of:

(a) providing an OLED substrate having at least two discernible fiducial marks which is usable for locating the position and orientation of the OLED substrate for properly depositing the emissive layer relative to pixel portions of the OLED substrate;

(b) providing a light source that provides a beam of light which is transversely and angularly movable to selected positions to change the location of a beam of light produced by such source relative to the OLED substrate;

(c) providing at least two unpatterned donor elements including emissive materials which respectively can emit different-colored light and each having an energy-absorbing layer, arranged so that when the donor elements are properly positioned relative to the OLED substrate, the beam of light can be absorbed by the energy-absorbing layer to heat the emissive material and cause the transfer of such emissive material to the OLED substrate;

(d) positioning the first donor element in a transfer relationship to the OLED substrate;

(e) detecting the location of the discernible feature on the OLED substrate to determine the position and orientation of the OLED substrate relative to the light source;

(f) angularly moving the beam of light and then moving the beam of light in a first transverse direction until a first end point is reached and then moving the beam of light in a perpendicular direction and again transversely moving the beam of light in a second direction parallel to but opposite to the first direction to a second end point and actuating the transversely moving beam of light in the first or second directions or both directions in accordance with the detected position and orientation of the OLED substrate by changing the timing of such actuation for illuminating different portions of the first donor element as the beam of light is moved to different transverse positions, whereby a plurality of emissive layers of the first colored light is deposited on the OLED substrate; and (g) repeating steps (d) through (f) for the second donor element until all the colored emissive layers are transferred to the OLED substrate.

12. The method of claim 11 further including using a thermal-expansion-compensation algorithm in step (f).

13. The method of claim 11 wherein step (e) is provided by a digital camera having a predetermined x-y viewing coordinate system for producing a digital image which is correlated with the x-y viewing coordinate system and a processing algorithm for processing such digital image.

14. The method of claim 13 further including the step of positioning the OLED substrate relative to the digital camera so that the digital camera can produce a digital image having the fiducial marks properly located for processing.

15. The method of claim 12 further including wherein the thermal-expansion-compensation algorithm compares the actual spacing between two discernible features to the nominal spacing to produce a correction factor.

16. The method of claim 15 further including providing three micropositioning devices for accomplishing step (f) and further including providing a precision metering device which provides predetermined pulses as the beam of light is moving in the first or second directions and wherein the thermal-expansion-compensation algorithm compares the number of pulses produced to the nominal spacing of the pixel portions modified by the correction factor to correctly actuate the beam of light.

17. A method for sequentially depositing different colored emissive layers which produce different-colored light for use in an organic light-emitting display device (OLED), comprising the steps of:

(a) providing an OLED substrate having at least two discernible fiducial marks which is usable for locating the position and orientation of the OLED substrate for properly depositing the emissive layer relative to pixel portions of the OLED substrate and a plurality of electrodes each associated with a particular pixel on the display;

(b) providing a light source that provides a beam of light which is transversely and angularly movable to selected positions to change the location of a beam of light produced by such source relative to the OLED substrate;

(c) providing at least two unpatterned donor elements including emissive materials which respectively can emit different-colored light and each having an energy-absorbing layer, arranged so that when the donor elements are properly positioned relative to the OLED substrate, the beam of light can be absorbed by the energy-absorbing layer to heat the emissive material and cause the transfer of such emissive material to the OLED substrate;

(d) positioning the first donor element in a transfer relationship to the OLED substrate;

(e) detecting the location of the discernible feature on the OLED substrate to determine the position and orientation of the OLED substrate relative to the light source;

(f) angularly moving the beam of light and then moving the beam of light in a first transverse direction until a first end point is reached and then moving the beam of light in a perpendicular direction and again transversely moving the beam of light in a second direction parallel to but opposite to the first direction to a second end point and actuating the transversely moving beam of light in the first or second directions or both directions in accordance with the detected position and orientation of the OLED substrate by changing the timing of such actuation for illuminating different portions of the first donor element as the beam of light is moved to different transverse positions, whereby a plurality of emissive layers of the first colored light is deposited relative to the corresponding electrodes on the OLED substrate; and (g) repeating steps (d) through (f) for the second donor element until all the colored emissive layers are transferred to the OLED substrate.

18. The method of claim 17 further including using a thermal-expansion-compensation algorithm in step (f).

19. The method of claim 17 wherein step (e) is provided by a digital camera having a predetermined x-y viewing coordinate system for producing a digital image which is correlated with the x-y viewing coordinate system and a processing algorithm for processing such digital image.

20. The method of claim 19 further including the step of positioning the OLED substrate relative to the digital camera so that the digital camera can produce a digital image having the fiducial marks properly located for processing.

21. The method of claim 18 further including wherein the thermal-expansion-compensation algorithm compares the actual spacing between two discernible features to the nominal spacing to produce a correction factor.

22. The method of claim 21 further including providing three micropositioning devices for accomplishing step (f) and further including providing a precision metering device which provides predetermined pulses as the beam of light is moved in the first or second directions and wherein the thermal-expansion-compensation algorithm compares the number of pulses produced to the nominal spacing of the pixel portions modified by the correction factor to correctly actuate the beam of light.

* * * * *